United States Patent [19]

Nakashiba

[11] Patent Number: 5,461,247
[45] Date of Patent: Oct. 24, 1995

[54] LOAD RESISTANCE STRUCTURE FOR SOURCE FOLLOWER IN CHARGE TRANSFER DEVICE

[75] Inventor: Yasutaka Nakashiba, Tokyo, Japan

[73] Assignee: NEC Corporation, Japan

[21] Appl. No.: 302,532

[22] Filed: Sep. 8, 1994

[30] Foreign Application Priority Data

Sep. 9, 1993 [JP] Japan .................................. 5-248786

[51] Int. Cl.⁶ ................................................ H01L 29/78
[52] U.S. Cl. ........................... 257/239; 257/237; 257/247
[58] Field of Search .................................. 257/220, 237, 257/239, 247

[56] References Cited

U.S. PATENT DOCUMENTS

| 4,668,971 | 5/1987 | Hynecek | 257/239 |
| 4,984,045 | 1/1991 | Matsunaga | 257/239 |
| 5,306,932 | 4/1994 | Miwada | 257/239 |
| 5,357,128 | 10/1994 | Shinji | 257/239 |

OTHER PUBLICATIONS

"Two-Phase Charge-Coupled Devices with Overlapping Polysilicon and Aluminum Gates", by W. F. Kosonocky et al. RCA Review, vol. 34, Mar. 1973, pp. 164–202.

*Primary Examiner*—Ngân V. Ngô
*Attorney, Agent, or Firm*—Ostrolenk, Faber, Gerb & Soffen

[57] ABSTRACT

Disclosed is a charge transfer device which has charge transfer registers, a floating diffusion layer for receiving a signal charge transferred from the charge transfer registers, a reset circuit for extracting a signal charge transferred from the floating diffusion layer and resetting a potential of the floating diffusion layer periodically to a predetermined potential, and an output circuit of a source follower formed by a MOSFET having a gate connected to the floating diffusion layer and a load resistance connected to a source of the MOSFET. The load resistance includes a substrate of a first conductivity type, a diffusion layer of a second conductivity type which is provided on the substrate, and a carrier accumulation layer of the first conductivity type which is provided at the top surface of the diffusion layer. The S/N ratio of the output circuit is improved since the channel of the load resistance of the source follower connected to the floating diffusion layer is completely separated from the interface level that exists at the silicon/oxide layer interface.

7 Claims, 3 Drawing Sheets 5,461,247

LOAD RESISTANCE STRUCTURE FOR SOURCE FOLLOWER IN CHARGE TRANSFER DEVICE

BACKGROUND OF THE INVENTION

(1) Field of the Invention

The present invention relates to a structure of a charge transfer device, and more particularly to the structure of the load resistance of a source follower used in its output circuit.

(2) Description of the Related Art

A conventional charge transfer device of the kind to which the present invention relates is first explained with reference to FIGS. 1A and 1B, FIGS. 2A and 2B, and FIGS. 3A and 3B. FIG. 1A shows an outline of the condition of an output section of the conventional charge transfer device. In FIG. 1A, the numeral 1 indicates a p-type semiconductor substrate, 2a indicates an n-type semiconductor region consisting of a charge transfer region and a floating diffusion layer region constituted inside the p-type semiconductor substrate 1, 4 indicates an n$^+$-type semiconductor region which is also constituted inside the p-type semiconductor substrate 1 and which gives a reset voltage to the floating diffusion layer, and 5 indicates a p$^+$-type semiconductor region which is constituted inside a surface region of the p-type semiconductor substrate 1 and which becomes a device isolating region. Further, on the n-type semiconductor region 2a, with an insulating film interposed, there are a plurality of conductive electrodes 7a, 7b and 7c constituting charge transfer electrodes, a conductive electrode 7d constituting an output gate electrode, and a conductive electrode 7e constituting a reset gate electrode. The n-type semiconductor region 2a and each of the charge transfer electrodes 7a, 7b and 7c constitute a charge transfer register.

Clock pulses $\Phi 1$, $\Phi 2$, $\Phi 3$, each differing in phase by 120° as shown in FIG. 1B, are respectively applied to interconnecting lines respectively connected to the charge transfer electrodes. As a result of this, for example, the signal charge below the conductive electrode 7a constituting a charge transfer electrode, is sequentially transferred to below the conductive electrodes 7b and 7c constituting charge transfer electrodes, and finally, after passing through the semiconductor region below the conductive electrode 7d constituting the output gate electrode, is transferred to the floating diffusion layer region of the n-type semiconductor region 2a. The potential change in the floating diffusion layer region due to the transfer of the signal charge is inputted to the gate of a MOSFET 8, and then, after an impedance conversion being performed by a source follower circuit constituted by this transistor and a load resistance 9 connected to the source of this transistor, is derived as a voltage output signal from an output terminal $V_{OUT}$. (Reference publication: W. F. Kosonocky and J. E. Carnes: Two-Phase Charge-Coupled Devices with Overlapping Polysilicon and Aluminium Gates, RCA Review Vol. 34, pp. 164–202).

FIG. 2A is a circuit diagram of the source follower, and FIG. 2B is an equivalent circuit diagram thereof. From the equivalent circuit diagram of FIG. 2B, the voltage gain $V_2/V_1$ of the source follower is expressed as follows:

$$V_2/V_1 = g_m r_{ds} R_s / (R_s + r_{ds} + g_m r_{ds} R_s)$$

but actually, $r_{ds} \gg R_s$ and hence, $$V_2/V_1 = g_m R_s / (1 + g_m R_s).$$

On the other hand, the output impedance, $Z_o$ is, $$Z_o = R_s r_{ds} / (R_s + r_{ds} + g_m r_{ds} R_s)$$

can be obtained.

Here, if we let, $R_s = 200\ \Omega$, $g_m = 20 \times 10^{-3} \Omega^{-1}$, $r_{ds} = 10^4\ \Omega$, then, the voltage gain, $V_2/V_1 = 0.8$, and the output impedance, $Z_o = 40\ \Omega$, hence, the source follower in which, although the voltage gain is less than 1 and the input impedance is large, the output impedance is smaller than the source load resistance, is suitable for impedance conversion and is widely used as the output circuit for charge transfer devices.

FIGS. 3A and 3B are the cross-sectional diagrams of MOSFETs that are presently widely used as the source load resistance of the source followers shown in FIG. 1A. FIG. 3A shows a surface type MOSFET, and in the same diagram, the numeral 1 indicates a p-type semiconductor substrate, 4 indicates an n$^+$-type semiconductor region that constitutes the source/drain region, 5 indicates a p$^+$-type semiconductor region that constitutes the device isolating region, 6 indicates a gate insulating film, and 7h indicates a conductive electrode that constitutes a gate electrode.

Further, FIG. 3B shows a buried type MOSFET, and in the same figure, the numeral 1 indicates a p-type semiconductor substrate, 2a indicates an n-type semiconductor region, 4 indicates an n$^+$-type semiconductor region that constitutes the source/drain region, 5 indicates a p$^+$-type semiconductor region that constitutes the device isolating region, 6 indicates a gate insulator film, and 7i indicates a conductive electrode that constitutes a gate electrode.

Each of the n$^+$-type semiconductor regions of the drain side of the MOSFETs shown in FIG. 3A and 3B is connected to a node "A" of the source follower shown in FIG. 1A.

In both the cases, the MOSFETs are designed to be used in the saturation state with the stability of voltage gain being taken into considerations. In the buried type MOSFET shown in FIG. 3B, electrons pass through a bulk region separated from the silicon/oxide film interface, so that the contact with the interface level existing at the silicon/oxide film interface is reduced in comparison to the surface type MOSFET of FIG. 3A, enabling low noise capability.

However, with the advance of manufacturing technology of semiconductor integrated circuits and the progress in miniaturization/compactness of charge transfer devices, the accompanying reduction in the number of electrons constituting the signal makes it difficult to obtain an output signal with a high signal/noise (S/N) ratio. The degradation of the S/N ratio can be further enhanced by charge transfer devices using output circuits of the conventional type technology as described above. This is because the channel of the MOSFET constituting the source load resistance in the conventional output circuits is not completely separated from the interface level at the silicon/oxide film interface, which is obvious in the case of the surface type as shown in FIG. 3A, and also in the case of the buried type as shown in FIG. 3B.

Thus, in solid state imaging devices constituted using such conventional charge transfer devices, the degradation of picture quality caused by S/N degradation is a defect.

SUMMARY OF THE INVENTION

An object of the invention, therefore, is to overcome the problems existing in the prior art and to provide a charge transfer device in which an S/N ratio of output circuit is improved by completely separating the channel of the load resistance of the source follower that is connected to the floating diffusion layer of charge detector section from the interface level that exists at the silicon/oxide layer interface.

According to one aspect of the invention, there is provided a charge transfer device having charge transfer registers formed by a charge transfer region and a plurality of charge transfer electrodes, a floating diffusion layer region for receiving a signal charge transferred from the charge transfer registers, a reset means for extracting the signal charge transferred from the floating diffusion layer region and resetting a potential of the floating diffusion layer region periodically to a predetermined potential, and a source follower formed by a MOSFET having a gate electrode connected to the floating diffusion layer region and a load resistance having one end connected to a source electrode of the MOSFET and the other end connected to ground, the load resistance comprising:

a p-type semiconductor substrate;

an n-type diffusion layer which is provided on the p-type semiconductor substrate; and a p-type carrier accumulation layer which covers an upper surface of the n-type diffusion layer.

According to another aspect of the invention, the p-type carrier accumulation layer is formed by the p-type semiconductor region.

According to still another aspect of the invention, the n-type diffusion layer has thereon an insulating film and a conductive electrode, the n-type diffusion layer having on a surface thereof a p-type carrier accumulation layer which is formed by applying a predetermined potential to the conductive electrode.

The charge transfer device according to the invention uses an n-type diffusion layer resistance set in between a p-type semiconductor substrate and a positive hole accumulation layer as a source load resistance of a MOSFET forming a source follower. Thus, electrons are able to pass through the bulk which is completely separated from the silicon/oxide interface, and because any connection with the interface level existing at the silicon/oxide film interface is completely eliminated, a noise reduction of the output circuit is achieved. Further, setting a shield electrode on the load resistance and using the fixed potential that exists on the load resistance, depletion of the positive hole accumulation layer is prevented, and fluctuation of the characteristics of the aforementioned load resistance due to the effect of the existence of the interface level at the silicon/oxide interface is prevented.

Thus, in the case where the charge transfer device according to this invention is applied to solid state imaging devices, a high quality picture can be obtained without a reduction in S/N ratio even when the devices are miniaturized and made finer in pursuit of a high definition picture element.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be explained with reference to the accompanying drawings.

Figure 4:
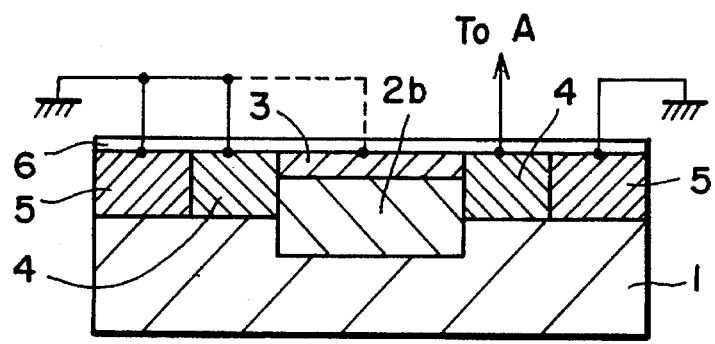
FIG. 4 is a diagrammatic sectional view of a load resistance for the source follower used in a charge transfer device of a first embodiment according to the invention.

FIG. 4 is a cross-sectional diagram of the load resistance of the source follower in the first embodiment of this invention. In FIG. 4, the numeral 1 indicates a p-type semiconductor substrate, 2b indicates an n-type semiconductor region constituting the channel of the load resistance, 3 indicates a $p^+$-type semiconductor region constituting a carrier accumulation layer which is formed to cover the top surface of the n-type semiconductor region 2b, 4 indicates an $n^+$-type semiconductor region formed on both sides of the n-type semiconductor region 2b, and 5 indicates a $p^+$-type semiconductor region constituting the device isolating region formed on the surface of the p-type semiconductor substrate 1. Further, the $p^+$-type semiconductor region 3 is electrically connected to the $p^+$-type semiconductor region 5 constituting the device isolating region, at the side surface of the n-type semiconductor region 2b of the load resistance (this electrical connection is shown by the dotted line in FIG. 4).

Figure 1A:
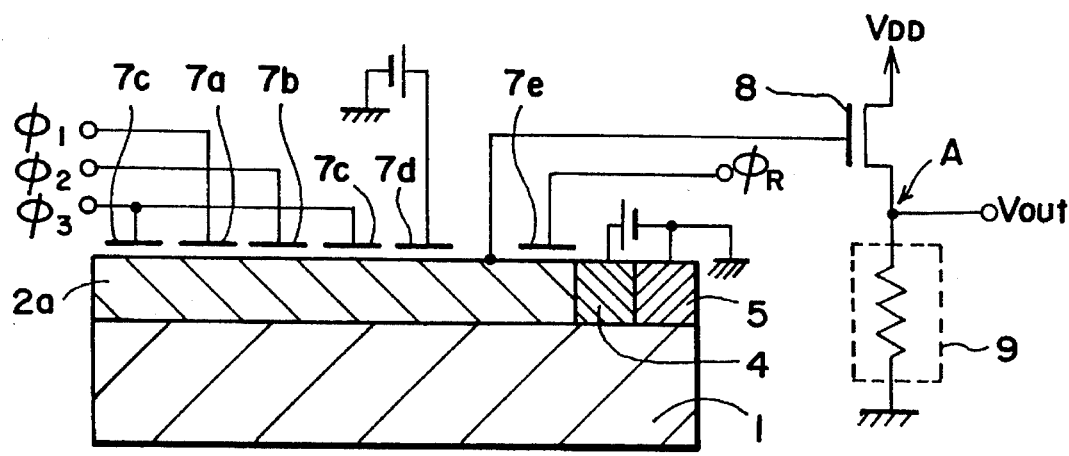
FIG. 1A is a diagrammatic sectional view of a conventional charge transfer device.
Figure 1B:
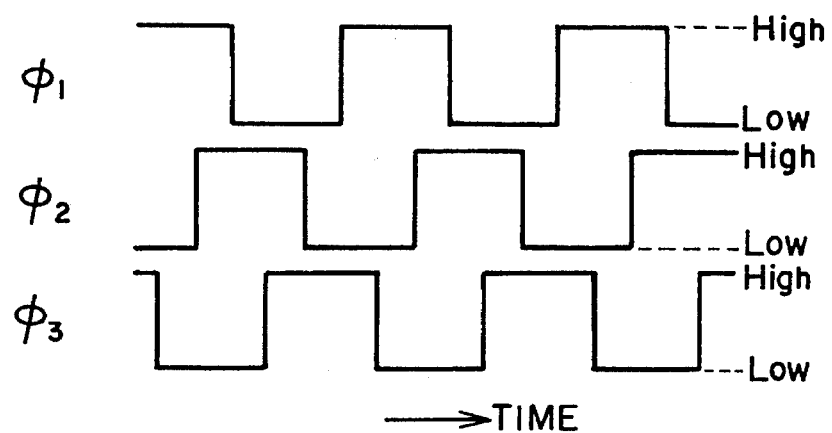
FIG. 1B is a diagram showing a phase relation of the transfer clocks applied in the device shown in FIG. 1A.
Figure 2A:
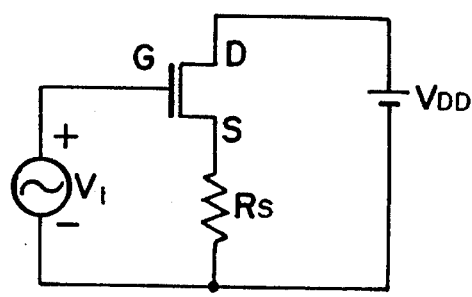
FIG. 2A is a circuit diagram of a source follower in the conventional device.
Figure 2B:
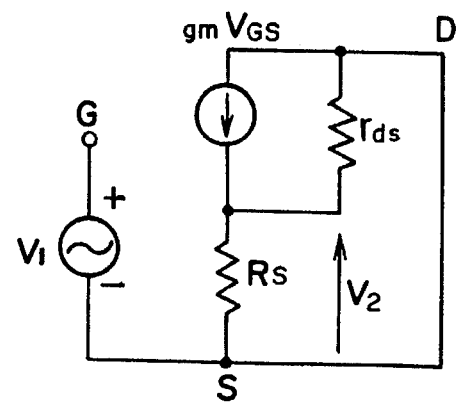
FIG. 2B is an equivalent circuit diagram of the source follower shown in FIG. 2A.
Figure 3A:
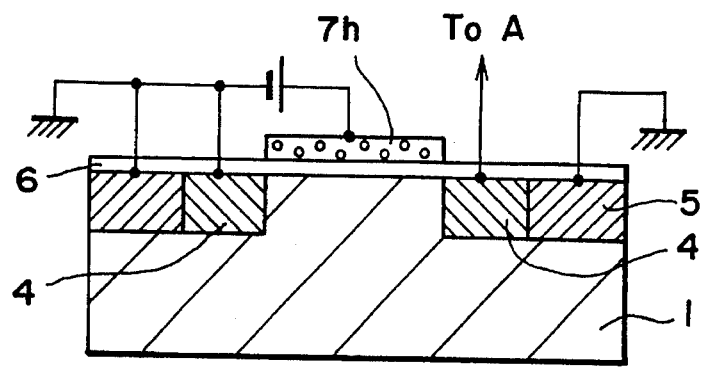
FIG. 3A is a diagrammatic sectional view of a conventional load resistance of a conventional source follower, with a surface type MOSFET used therein.
Figure 3B:
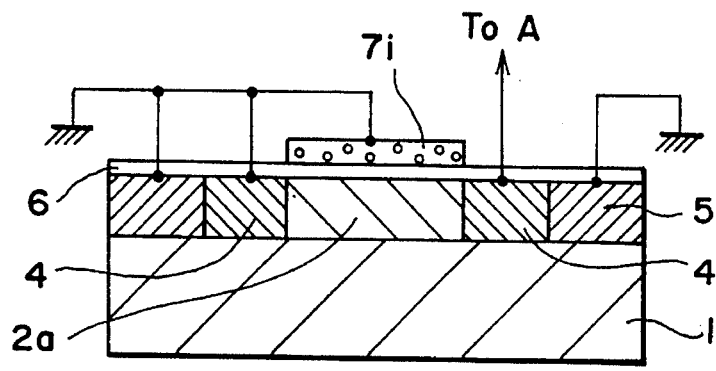
FIG. 3B is a diagrammatic sectional view of a conventional load resistance of a conventional source follower, with a buried type MOSFET used therein.

The overall structure of this embodiment is substantially the same as that of the charge transfer device shown in FIG. 1A, and the operation thereof is also the same as that of FIG. 1A device. One end of the load resistance of this embodiment, that is, one of the $n^+$-type semiconductor regions 4 is grounded and the other end thereof, that is, the other $n^+$-type semiconductor region 4 is connected to the node A of the source follower shown in FIG. 1A.

In the first embodiment of this invention shown in FIG. 4, the $p^+$-type semiconductor region 3 constituting the carrier accumulation layer is formed on the surface of the load resistance constituted by the n-type semiconductor region 2b which is formed in the surface of the p-type semiconductor substrate 1, and this $p^+$-type semiconductor region 3 is fixed at a reference voltage via the $p^+$-type semiconductor region 5. By this structure, it is possible to pass electrons through the bulk which is completely separated from the silicon/oxide film interface, and because it is possible to completely eliminate any connection with the interface level existing at the silicon/oxide film interface, a noise reduction of approximately 1.5 dB is attainable compared to the S/N ratio of conventional examples.

Figure 5:
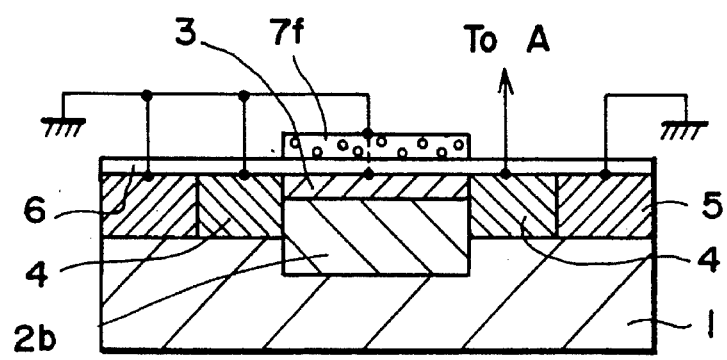
FIG. 5 is a diagrammatic sectional view of a load resistance for the source follower used in a charge transfer device of a second embodiment according to the invention.

FIG. 5 shows, in a cross-sectional diagram, a load resistance of the source follower of the second embodiment of this invention. The load resistance of this embodiment is also used in the charge transfer device shown in FIG. 1A, and one of the terminals of the load resistance is to be connected to the junction node A of FIG. 1A. In FIG. 5, the numeral 1 indicates a p-type semiconductor substrate, 2b indicates an n-type semiconductor region constituting the load resistance, 3 indicates a p$^+$-type semiconductor region constituting the carrier accumulation layer, 4 indicates an n$^+$-type semiconductor region, 5 indicates a p$^+$-type semiconductor region constituting the device isolating region, 6 indicates a gate insulating film, and 7f indicates a conductive electrode constituting a shield electrode. Further, the p$^+$-type semiconductor region 3 is electrically connected with the p$^+$-type semiconductor region 5 constituting the device isolating region, at the side surface of the n-type semiconductor region 2b of the load resistance (this connection is shown by the dotted line in FIG. 5), and also the conductive electrode 7 constituting the shield electrode is electrically connected by metal interconnection with the p$^+$-type semiconductor region 5 constituting the device isolating region (this connection is shown by a solid line in FIG. 5).

In the load resistance of the second embodiment of this invention shown in FIG. 5, because the p$^+$-type semiconductor region 3 constituting the carrier accumulation layer is formed on the upper surface of the n-type semiconductor region 2b constituting the load resistance formed in the surface of the p-type semiconductor substrate 1, and it is fixed to the reference voltage, in the same way as explained for the first embodiment, it is possible to pass electrons through the bulk which is completely separated from the silicon/oxide film interface, and it is possible to completely eliminate any connection with the interface level existing at the silicon/oxide film interface. As a result, a noise reduction of approximately 1.5 dB is attainable compared to the S/N ratio of the conventional examples. Furthermore, in the case of the load resistance of this embodiment, due to the grounded conductive electrode 7f constituting the shield electrode, the depletion of the aforementioned p$^+$-type semiconductor region 3 due to the fixed charge existing above the aforementioned load resistance is eliminated, and the fluctuation of the characteristics of the load resistance due to the effect of the existence of the interface level at the silicon/oxide film interface can be prevented.

Also, in this second embodiment, although an example of the application of a reference voltage to the conductive electrode 7f constituting the shield electrode has been explained, the application of a negative voltage is also acceptable.

Figure 6:
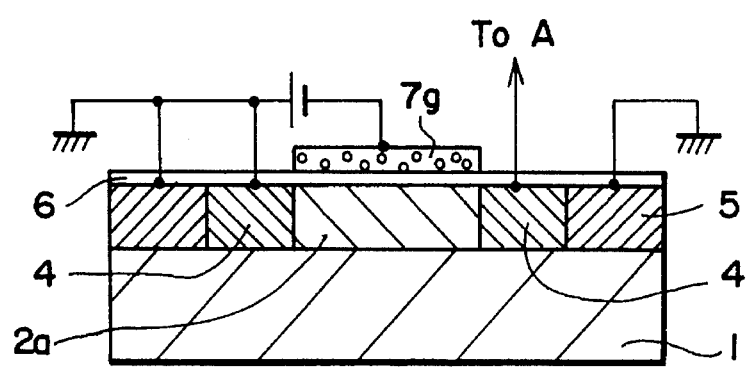
FIG. 6 is a diagrammatic sectional view of a load resistance for the source follower used in a charge transfer device of a third embodiment according to the invention.

FIG. 6 is a cross-sectional diagram of a load resistance of the source follower in the third embodiment of this invention. The load resistance of this embodiment is also used in the charge transfer device shown in FIG. 1A, and one of the terminals of the load resistance is to be connected to the junction node A of FIG. 1A.

In FIG. 6, the numeral 1 indicates a p-type semiconductor substrate, 2a indicates an n-type semiconductor region constituting the channel of the load resistance, 4 indicates an n$^+$-type semiconductor region formed on both sides of the n-type semiconductor region 2a, 5 indicates a p$^+$-type semiconductor region constituting the device isolating region, 6 indicates a gate insulating film, and 7g indicates a conductive electrode constituting a shield electrode and a gate electrode. Further, a negative potential is given to the conductive electrode 7g constituting the gate electrode and the shield electrode, so as to form a positive hole accumulation layer at the surface of the n-type semiconductor region 2a.

In the load resistance of the third embodiment of this invention shown in FIG. 6, a desired negative potential is applied to the conductive electrode 7g constituting the shield electrode and the gate electrode thereby forming a positive accumulation layer at the surface of the load resistance which is constituted by the n-type semiconductor region 2a formed on the surface of the p-type semiconductor substrate 1, and this positive accumulation layer is fixed to the reference potential. By the structure thus formed, it is possible to pass electrons through the bulk which is completely separated from the silicon/oxide film interface, and because it is possible to completely eliminate any connection with the interface level existing at the silicon/oxide film interface, a noise reduction of approximately 1.5 dB is attainable compared to the S/N ratio of the conventional examples.

A detailed numerical example can be considered where the channel width of the load resistance is made 50 μm, the impurity concentration of the p-type semiconductor substrate 1 is made $1 \times 10^{16}$ cm$^{-3}$, the impurity concentration of the n-type semiconductor region 2a is made $8 \times 10^{16}$ cm$^{-3}$, the impurity concentration of the p$^+$-type semiconductor region constituting the device isolating region is made $1 \times 10^{18}$ cm$^{-3}$ and the film thickness is made 750 Angstroms of the silicon dioxide for the gate insulating film 6, and where the conductive electrode 7g constituting the gate electrode and the shield electrode is formed with polycrystalline silicon film, the negative potential required to be applied to the conductive electrode 7g constituting the gate electrode and the shield electrode is less than −10 V.

The present invention has been described with reference to preferred embodiments but is not limited to these embodiments, as it would be obvious to those skilled in the art that various changes, improvements, and combinations are possible. For example, in the embodiment, a three-phase mode buried channel type charge coupled device has been explained, but this can be changed to an operation mode of greater than three phases or surface channel type.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A charge transfer device having charge transfer registers formed by a charge transfer region and a plurality of charge transfer electrodes, a floating diffusion layer region for receiving a signal charge transferred from said charge transfer registers, a reset means for extracting the signal charge transferred from said floating diffusion layer region and resetting a potential of said floating diffusion layer region periodically to a predetermined potential, and a source follower formed by a MOSFET having a gate electrode connected to said floating diffusion layer region and a load resistance having one end connected to a source electrode of said MOSFET and the other end connected to ground, said load resistance comprising:

a semiconductor substrate of a first conductivity type;

a diffusion layer of a second conductivity type which is provided on said semiconductor substrate; and a carrier accumulation layer of the first conductivity type which covers an upper surface of said diffusion layer.

2. The charge transfer device according to claim 1, wherein said carrier accumulation layer of the first conductivity type is formed by a semiconductor region of the first conductivity type.

3. The charge transfer device according to claim 2, which comprises a conductive electrode constituting a shield electrode and in which said conductive electrode is provided above said semiconductor region of the first conductivity type with an insulating film interposed therebetween.

4. The charge transfer device according to claim 3, wherein said shield electrode is applied with the same potential as that applied to said semiconductor region of the first conductivity type.

5. The charge transfer device according to claim 1, which comprises a conductive electrode provided above said diffusion layer of the second conductivity type with an insulating film interposed therebetween, said carrier accumulation layer of the first conductivity type being formed in a surface of said diffusion layer of the second conductivity type by applying a predetermined potential to said conductive electrode.

6. The charge transfer device according to claim 5, wherein said first conductivity type is a p-type and said second conductivity type is an n-type.

7. The charge transfer device according to claim 6, wherein a positive hole accumulation layer is formed at the surface of said diffusion layer by applying a negative potential to said conductive electrode.

* * * * *